United States Patent
Scheiper (10) Patent No.: US 8,481,374 B2
(45) Date of Patent: Jul. 9, 2013

(54) SEMICONDUCTOR ELEMENT COMPRISING A LOW VARIATION SUBSTRATE DIODE

(75) Inventor: Thilo Scheiper, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 273 days.

(21) Appl. No.: 12/914,123

(22) Filed: Oct. 28, 2010

(65) Prior Publication Data

US 2011/0186957 A1 Aug. 4, 2011

(30) Foreign Application Priority Data

Jan. 29, 2010 (DE) .................... 10 2010 001 405

(51) Int. Cl.
*H01L 21/70* (2006.01)
*H01L 21/00* (2006.01)

(52) U.S. Cl.
USPC ........... 438/156; 257/506; 257/508; 257/509; 257/510

(58) Field of Classification Search
USPC ........... 438/149–166; 257/506–510, 347–363
See application file for complete search history.

(56) References Cited

U.S. PATENT DOCUMENTS

| | | | |
|---|---|---|---|
| 6,197,663 B1 * | 3/2001 | Chandross et al. | 438/455 |
| 6,287,901 B1 * | 9/2001 | Christensen et al. | 438/162 |
| 6,566,713 B2 * | 5/2003 | Nii | 257/347 |
| 7,009,249 B2 * | 3/2006 | Nii | 257/347 |
| 7,473,904 B2 * | 1/2009 | Abadeer et al. | 250/370.14 |
| 7,521,776 B2 * | 4/2009 | Cannon et al. | 257/627 |
| 7,608,903 B2 * | 10/2009 | Mouli | 257/431 |
| 2002/0113267 A1 * | 8/2002 | Brown et al. | 257/355 |
| 2003/0094654 A1 * | 5/2003 | Christensen et al. | 257/347 |
| 2004/0046208 A1 * | 3/2004 | Dennard et al. | 257/347 |
| 2008/0036029 A1 * | 2/2008 | Liu et al. | 257/510 |

OTHER PUBLICATIONS

Translation of Official Communication from German Patent Office for German Patent Application No. 10 2010 001 405.2-33 dated Oct. 12, 2010.

* cited by examiner

*Primary Examiner* — Fernando L Toledo
*Assistant Examiner* — Karen Kusumakar
(74) *Attorney, Agent, or Firm* — Williams, Morgan & Amerson, P.C.

(57) ABSTRACT

A substrate diode of an SOI device may be formed on the basis of contact regions in an early manufacturing stage, i.e., prior to patterning gate electrode structures of transistors, thereby imparting superior stability to the sensitive diode regions, such as the PN junction. In some illustrative embodiments, only one additional deposition step may be required compared to conventional strategies, thereby providing a very efficient overall process flow.

17 Claims, 8 Drawing Sheets

SEMICONDUCTOR ELEMENT COMPRISING A LOW VARIATION SUBSTRATE DIODE

BACKGROUND OF THE INVENTION

1. Field of the Invention

Generally, the present disclosure relates to integrated circuits, and, more particularly, to SOI semiconductor devices comprising substrate diodes that are formed in the crystalline material of the substrate.

2. Description of the Related Art

The fabrication of integrated circuits requires a large number of circuit elements, such as transistors and the like, to be formed on a given chip area according to a specified circuit layout. Generally, a plurality of process technologies are currently practiced, wherein, for complex circuitry, such as microprocessors, storage chips, ASICs (application specific ICs) and the like, CMOS technology is one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed above a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on, among other things, the distance between the source and drain regions, which is also referred to as channel length. Therefore, reducing the feature sizes and in particular the gate length of the field effect transistor has been an important design criterion.

In view of further enhancing performance of transistors, in addition to other advantages, the SOI (semiconductor- or silicon-on-insulator) architecture has continuously been gaining in importance for manufacturing MOS transistors due to their characteristics of a reduced parasitic capacitance of the PN junctions, thereby allowing higher switching speeds compared to bulk transistors. In SOI transistors, the semiconductor region, in which the drain and source regions, as well as the channel region, are located, also referred to as the body, is dielectrically encapsulated. This configuration provides significant advantages, but also gives rise to a plurality of issues. Contrary to the body of bulk devices, which is electrically connected to the substrate and, thus, applying a specified potential to the substrate maintains the bodies of bulk transistors at a specified potential, the body of SOI transistors is not connected to a specified reference potential, and, hence, the body's potential may usually float, due to accumulating minority charge carriers, unless appropriate countermeasures are taken.

A further issue in high performance devices, such as microprocessors and the like, is an efficient device internal temperature management, due to the significant heat generation of the transistors. Due to the reduced heat dissipation capability of SOI devices caused by the buried insulating layer, the corresponding sensing of the momentary temperature in SOI devices is of particular importance.

Typically, for thermal sensing applications, an appropriate diode structure may be used, wherein the characteristic of the diode may permit information to be obtained on the thermal conditions in the vicinity of the diode structure. The sensitivity and the accuracy of the respective measurement data obtained on the basis of the diode structure may significantly depend on the diode characteristic, i.e., on the diode's current/voltage characteristic, which may depend on temperature and other parameters. For thermal sensing applications, it may, therefore, typically be desirable to provide a substantially "ideal" diode characteristic in order to allow a precise estimation of the temperature conditions within the semiconductor device. In SOI devices, a corresponding diode structure, i.e., the respective PN junction, is frequently formed in the substrate material located below the buried insulating layer, above which is formed the "active" semiconductor layer used for forming therein the transistor elements. Thus, at least some additional process steps may be required, for instance, for etching through the semiconductor layer or a corresponding trench isolation area and through the buried insulating layer in order to expose the crystalline substrate material. On the other hand, the process flow for forming the substrate diode is typically designed so as to exhibit a high degree of compatibility with the process sequence for forming the actual circuit elements, such as the transistor structures.

For instance, typically, the PN junction of the substrate diode in the crystalline substrate material is formed on the basis of implantation processes, which are also applied in the device layer or active semiconductor layer for forming deep drain and source regions therein, in order to provide an efficient overall manufacturing flow. In this case, an opening, also referred to as a substrate window, is substantially formed so as to extend through the buried insulating layer and into the crystalline substrate material prior to performing the corresponding implantation process. Consequently, the dopant species is introduced into the crystalline substrate material, i.e., into the portion exposed by the substrate window, so that the PN junction is substantially aligned to the sidewalls of the substrate window, thereby providing a certain "overlap," due to the nature of the implantation process and due to any subsequent anneal processes that are required for activating the dopant species in the drain and source regions of the transistors and to re-crystallize implantation-induced damage. Therefore, the characteristics of the PN junction of the substrate diode strongly depend on the characteristics of the PN junctions in the transistor elements, which, however, may not necessarily have a desired "ideal" diode characteristic. Furthermore, during the further processing, sophisticated metal silicide regions may be formed in the drain and source regions of the transistors, wherein these metal silicide regions are also formed in the doped areas of the substrate diode in the crystalline substrate material, wherein, however, due to device requirements for sophisticated transistors, highly conductive refractory metals, such as nickel, may frequently be applied, which may result in undue nickel diffusion. Consequently, the characteristics of the PN junction in the substrate diode may also depend on the characteristics of the metal silicide, wherein even nickel silicide protrusions may "bridge" the PN junction, thereby further deteriorating the overall performance of the substrate diode. Additionally, during the further processing, contact elements have to be formed so as to connect to the circuit elements in the device level and also to connect to the substrate diode, which may also result in certain irregularities and variabilities of the resulting diode behavior, as will be described in more detail with reference to FIGS. 1a-1f.

Figure 1A:
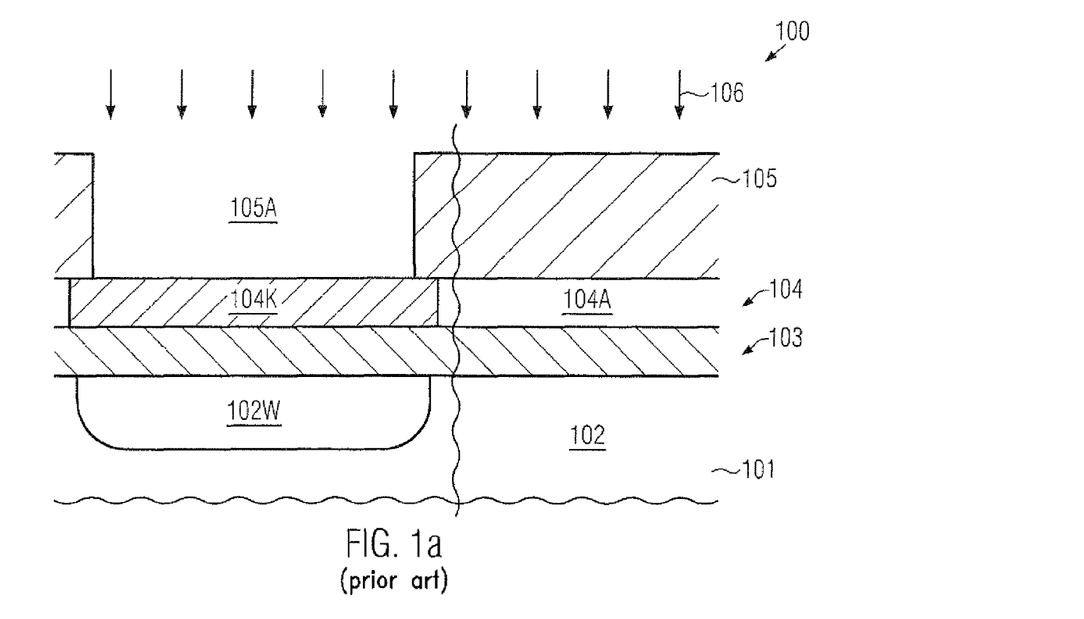
FIGS. 1a-1f schematically illustrate cross-sectional views of a semiconductor device during various manufacturing stages when forming a substrate diode and transistor elements according to a conventional process strategy.

FIG. 1a schematically illustrates a cross-sectional view of a semiconductor device 100 in an early manufacturing stage. As illustrated, the semiconductor device 100 comprises a substrate 101 comprising, at least in an upper portion thereof, a crystalline substrate material 102, such as a silicon material. Moreover, a buried insulating layer 103, for instance comprised of silicon dioxide, is provided above the crystalline substrate material 102 and, thus, vertically isolates a device layer 104 from the substrate material 102. The device layer 104 may initially represent a crystalline semiconductor material, such as a silicon material, and comprises, in the manufacturing stage shown, a plurality of "active" regions 104A, which are to be understood as semiconductor regions, in and above which circuit elements, such as transistors, have to be formed in a later manufacturing stage. Furthermore, the device layer 104 comprises one or more isolation structures 104K, which are typically provided in the form of shallow trench isolations in sophisticated semiconductor devices. For instance, the isolation structure 104K may be substantially comprised of silicon dioxide. Moreover, an implantation mask 105, such as a resist mask, is formed above the device layer 104 and comprises an opening 105A, which defines the lateral position and size of a "substrate window," in which a substrate diode is to be formed in the crystalline substrate material 102.

The semiconductor device 100 as illustrated in FIG. 1a may be formed on the basis of the following process strategy. The isolation structure 104K and any other isolation structures for laterally delineating the active regions, such as the active region 104A, in the device layer 104 are formed by providing trenches in the semiconductor layer 104 on the basis of sophisticated lithography and etch techniques, wherein any additional materials, such as hard mask materials and the like, are provided so as to obtain precise control of the lithography and etch process for forming the isolation trenches. Next, the trenches are filled with an appropriate insulating material, such as silicon dioxide, and any excess material thereof may be removed on the basis of chemical mechanical polishing (CMP), wherein a hard mask material, such as silicon nitride, may be used as an efficient stop layer. Next, the hard mask material may be removed by using wet chemical etch recipes and a plurality of implantation processes are typically performed based on appropriate masking regimes so as to establish the basic doping in the active regions 104A, for instance for N-channel transistors, P-channel transistors and the like. Prior to or after these "well implantations" for the active regions 104A, the implantation mask 105 is applied and a high energy implantation process 106 is performed so as to implant a well dopant species into the crystalline substrate material 102 through the layers 104 and 103, thereby forming a substrate well region 102W of a desired conductivity. For example, an N-type dopant species is used in order to form a PN junction with a P-type dopant species that is to be incorporated in a later manufacturing stage, when forming drain and source regions of P-channel transistors. It should be appreciated that a P-type dopant species may also be used to provide the substrate well region 102W, if desired. Thereafter, an anneal process is typically performed to activate the dopant species in the active region 104A and in the substrate well region 102W, thereby also reducing implantation-induced damage in the crystalline materials.

Figure 1B:
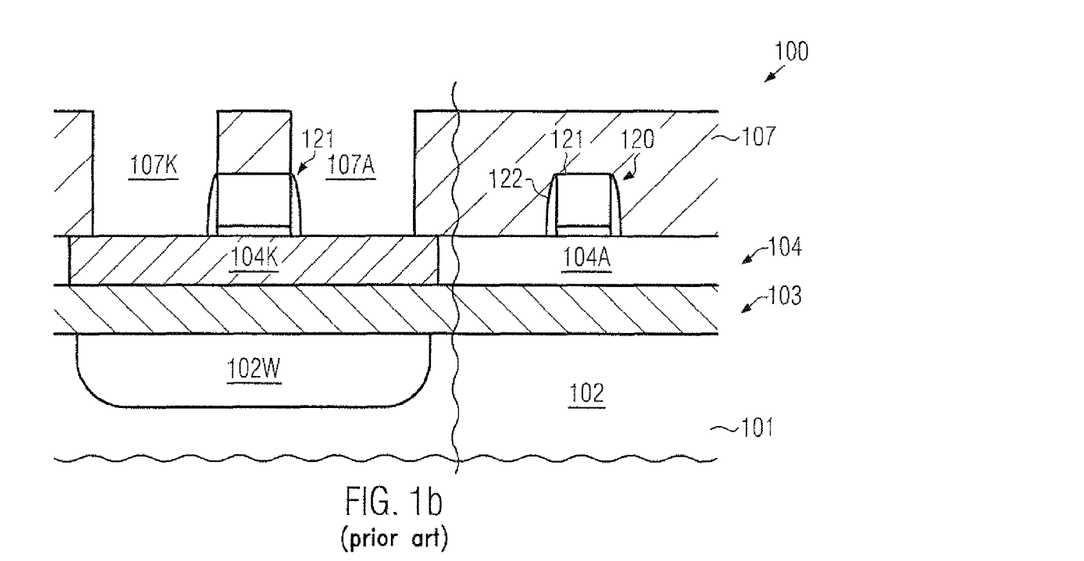

FIG. 1b schematically illustrates the semiconductor device 100 in a further advanced manufacturing stage, in which at least a part of a transistor 120 is formed in and above the active region 104A. The transistor 120 may comprise, in this manufacturing stage, a gate electrode structure 121, possibly in combination with a spacer element 122. Similarly, a "gate electrode structure" 121 is formed above the isolation structure 104K and has any appropriate lateral dimension so as to comply with the design requirements for forming contact elements and highly doped regions in the substrate well region 102W for providing a substrate diode. Moreover, an etch mask 107 is formed above the device layer 104 and comprises corresponding openings 107K, 107A, which, in combination with the structure 121, define the lateral size and position of openings to be formed so as to extend into the substrate well region 102W.

The semiconductor device 100 is typically formed in accordance with any appropriate manufacturing strategy for providing transistors in and above the active regions of the device layer 104, such as the transistor 120 formed in and above the active region 104A. For example, a gate dielectric material, in combination with an electrode material, such as polysilicon, metal-containing electrode materials and the like, are formed above the device layer 104 and are subsequently patterned by using sophisticated lithography and etch techniques. To this end, any further materials, such as dielectric cap materials, hard mask materials and the like, are typically provided in order to form the gate electrode structure 121 of the transistor 120 with the desired critical dimensions, which may be 50 nm and less in sophisticated semiconductor devices. At the same time, the structure 121 above the isolation structure 104K is provided, typically on the basis of less critical lateral dimensions, so that the structure 121 may in addition to the etch mask 107 act as a further etch mask in order to provide the corresponding openings to be formed in the isolation structure 104K and the buried insulating layer 103 with superior precision.

Figure 1C:
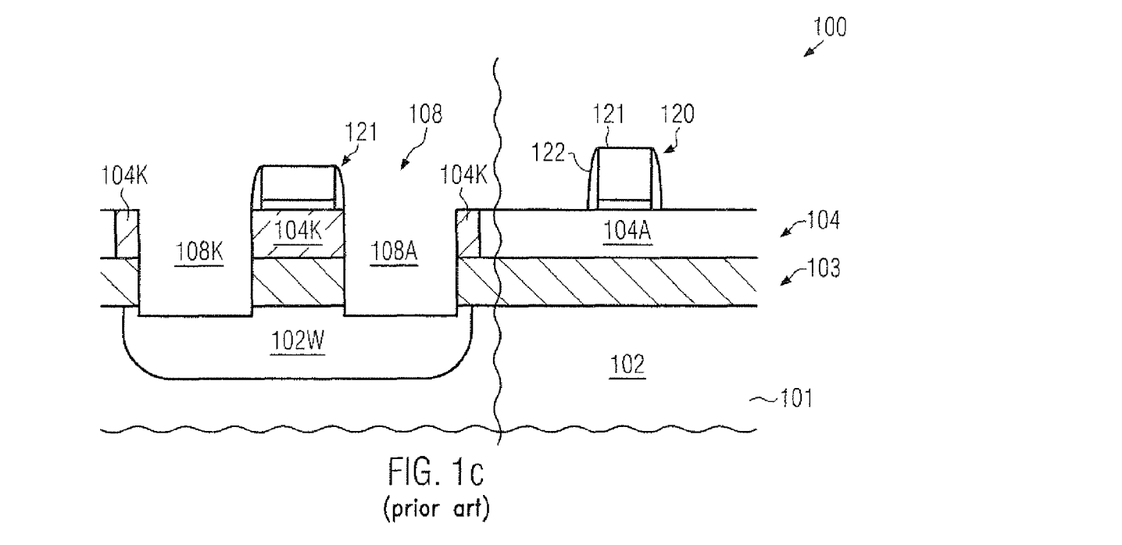

FIG. 1c schematically illustrates the semiconductor device 100 with a substrate window 108, which may be understood as the residue of the structure 121 in combination with the underlying portions of the isolation structure 104K and the buried insulation layer 103 in combination with corresponding openings 108K, 108A, which extend through the isolation structure 104K and the buried insulating layer 103 into the substrate well region 102W. The openings 108K, 108A may be formed on the basis of the etch mask 107 (FIG. 1b) by using appropriate plasma assisted etch recipes, for instance for etching through silicon dioxide material selectively with respect to resist material, silicon material and the like. After removing the etch mask, the further processing is continued by forming drain and source regions in the transistors in the device layer 104, thereby concurrently forming highly doped regions in the substrate well region 102W.

Figure 1D:
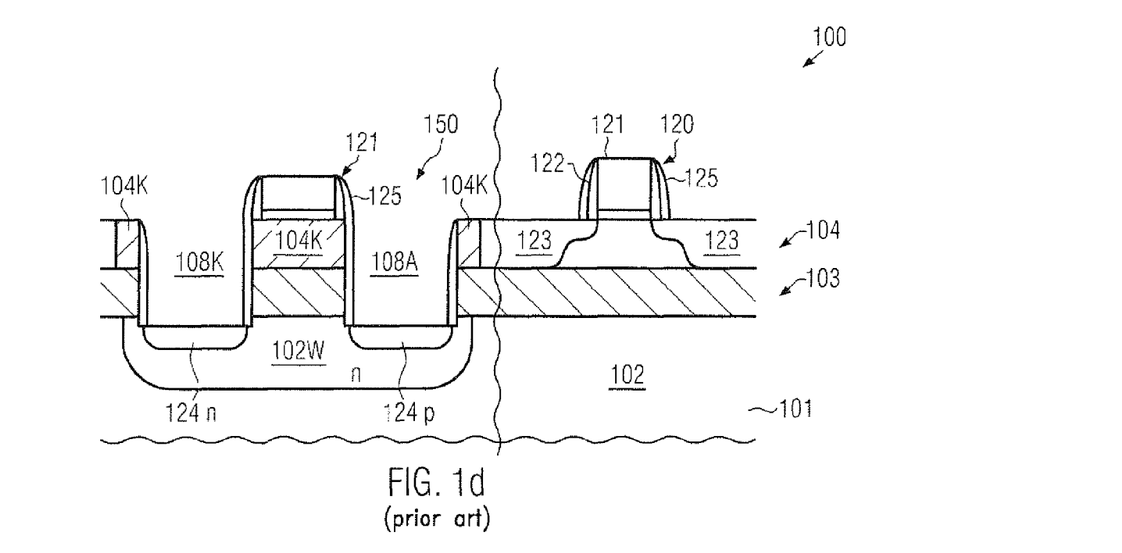

FIG. 1d schematically illustrates the semiconductor device 100 after any implantation processes for providing drain and source regions. As illustrated, the transistor 120, which, in the example shown, may represent a P-channel transistor, comprises highly doped drain and source regions 123, which may be formed on the basis of a further spacer structure 125, depending on the overall process strategy, i.e., depending on the requirements for profiling the lateral and vertical dopant profile in the transistor 120. It should be appreciated that, in any N-channel transistors (not shown), corresponding highly doped drain and source regions having an N-type conductivity are provided based on an appropriate masking regime. Similarly, a highly P-doped semiconductor region 124p is also provided in the substrate well region 102W. Consequently, in this case, the highly doped region 124p may represent an anode of a substrate diode 150 and may, thus, form a PN junction with the well region 102W. On the other hand, a highly N-doped region 124n is provided and may, thus, represent a cathode of the diode 150, wherein the highly doped region 124n may result in a desired reduced contact resistance of the substrate diode 150. Since the dopant species for the highly doped regions 124p, 124n of the substrate diode 150 have been incorporated via the openings 108A and 108K, respectively, the characteristics of the resulting PN junction are substantially determined by the implantation parameters and the characteristics of a subsequent anneal process, during which a certain degree of dopant diffusion may take place.

Figure 1E:
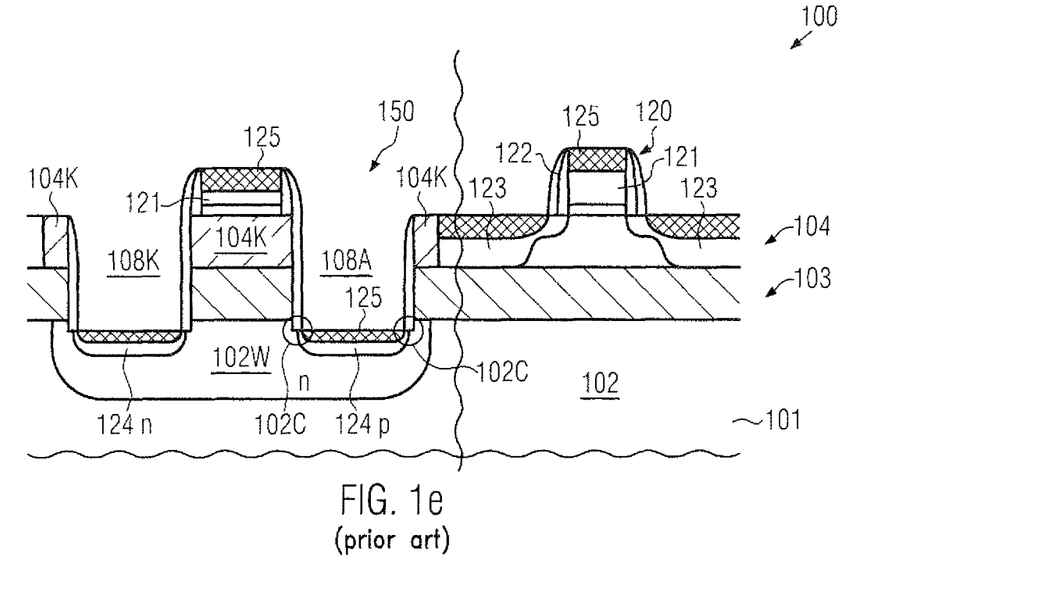

FIG. 1e schematically illustrates the semiconductor device 100 in a further advanced manufacturing stage. As illustrated, metal silicide, such as nickel silicide regions 125, are formed in the transistor 120, i.e., in the drain and source regions 123 and the gate electrode 121. Similarly, metal silicide regions 125 are formed in the highly doped regions 124p, 124n of the substrate diode 150, and possibly in the residue of the structure 121 of the substrate diode 150. The metal silicide regions 125 may be provided on the basis of any appropriate process strategy, i.e., depositing a refractory metal, such as nickel, and initiating metal diffusion, thereby forming the metal silicide. Thereafter, any non-reacted metal material, for instance formed on dielectric surface areas, is removed by efficient wet chemical etch techniques. It should be appreciated that, prior to the silicidation process, typically, appropriate cleaning recipes are applied, wherein a certain degree of material erosion in the regions 124p, 124n of the substrate diode 150 may occur. Consequently, upon forming the metal silicide 125 in these regions, a distance of the regions 125 with respect to the PN junction defined by the well region 120W and the highly doped region 124p may vary, thereby contributing to an increased variability of the resulting diode characteristics. Furthermore, a certain risk of creating nickel silicide protrusions may exist, in particular, if generally the implantation dose for forming the drain and source regions 123 may have to be reduced upon reducing the overall lateral dimensions of the transistor 120. Consequently, in particular at critical areas 102C, the characteristics of the PN junctions and, thus, of the substrate diode 150 as a whole may significantly depend on the specific process history.

Figure 1F:
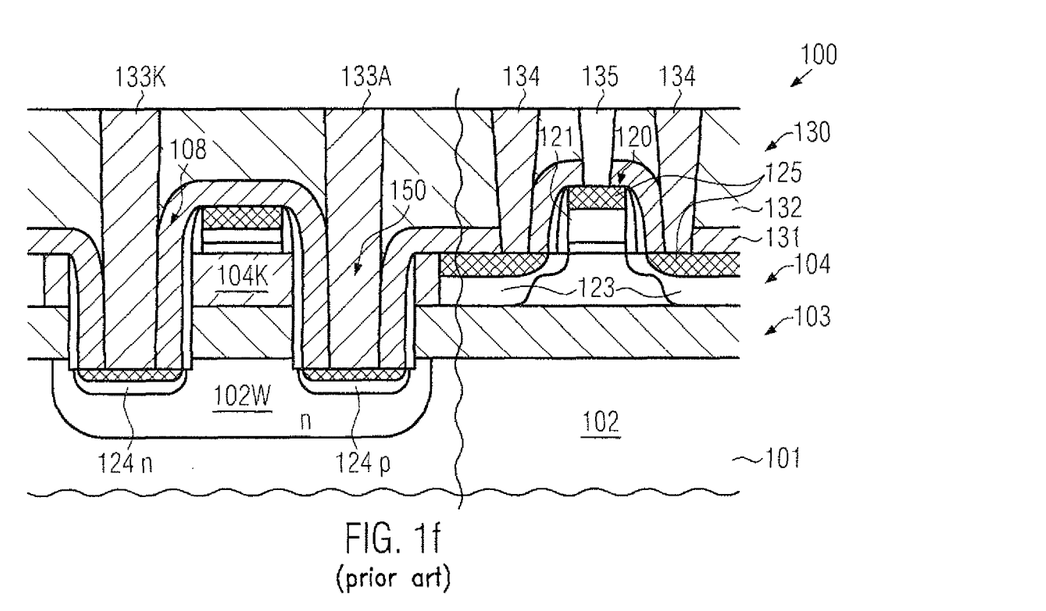

FIG. 1f schematically illustrates the semiconductor device 100 in a further advanced manufacturing stage. As illustrated, an interlayer dielectric material 130 is formed above the device layer 104, thereby laterally embedding the transistor 120 and also passivating and enclosing the substrate diode 150. Frequently, the interlayer dielectric material 130 is provided in the form of two or more individual material layers, such as layers 131, 132, which are frequently comprised of silicon nitride and silicon dioxide, respectively. Furthermore, contact elements 133A, 133K are formed in the interlayer dielectric material 130 and connect to the substrate diode 150, while contact elements 134, 135 are provided so as to connect to the transistor 120, for instance to the drain and source regions 123 thereof and to the gate electrode structure 121 thereof.

The interlayer dielectric material 130 is typically formed by depositing the material 131, for instance, by plasma enhanced chemical vapor deposition (CVD) techniques so as to provide a silicon nitride material. Thereafter, the layer 132, for instance in the form of silicon dioxide, is deposited, for instance by sub-atmospheric CVD, high density plasma CVD and the like. Due to the presence of the substrate window 108, a pronounced surface topography may be created, even after planarizing the material 132 on the basis of well-established CMP techniques. Thereafter, an etch mask is formed on the basis of sophisticated lithography processes and the interlayer dielectric material 130 is patterned by applying plasma assisted etch recipes. During the corresponding etch process, very different etch depths in the substrate window 108 and for the device layer 104 have to be provided, thereby requiring superior etch stop capabilities of the silicon nitride material 125 in the transistor 120. Consequently, the silicon nitride material 125 is frequently formed according to process parameters which take into consideration, besides a moderately high resistance and a desired thermal stability, the etch stop characteristics required during the patterning of openings for the contact elements 133A, 133K. Consequently, these adaptations of material characteristics of the material 125 may also have an influence on the finally achieved characteristics of the substrate diode 150. Furthermore, the presence of the material 131 in the form of a silicon nitride material may also reduce the "ideality" of the substrate diode 150, wherein, however, the reason for this behavior is yet unknown. Consequently, upon forming the contact elements 133K, 133A and 134, 135, etch damage may be created in the transistor 120, while, on the other hand, performance of the substrate diode 150 may deteriorate, as discussed above.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which the substrate diode of an SOI device may be formed prior to patterning gate electrodes of transistors in the device level, wherein, at the same time, a high degree of compatibility with conventional process strategies may be preserved. In some illustrative aspects disclosed herein, the openings for connecting to the crystalline substrate material may be formed in combination with isolation structures, thereby enabling a highly efficient overall manufacturing flow, wherein, in particular, contact regions of the substrate diode may be provided prior to actually forming other circuit elements, such as gate electrode structures. To this end, appropriate conductive materials, such as silicon, silicon/germanium, carbon and the like, may be used for filling the openings of the substrate diode, which may, thus, enable performing any subsequent high temperature processes without sacrificing the electronic behavior of the contact elements. In this manner, the interlayer dielectric material and any contact element to be formed therein so as to connect to the device layer and to the substrate diode may have substantially no influence on the characteristics of the substrate diode, thereby providing superior uniformity of the resulting diode behavior. Moreover, a superior "decoupling" of the diode characteristics with respect to the characteristics of sophisticated transistor elements may be accomplished by applying the principles disclosed herein. Furthermore, generally, a superior surface topography and reduced complexity for providing the interlayer dielectric material and the contact elements may be achieved, which may also contribute to overall superior device characteristics.

One illustrative method disclosed herein relates to forming a substrate diode in a semiconductor device. The method comprises forming a first opening through a first trench isolation structure and forming a second opening through a second trench isolation structure, wherein the first and second openings extend through a buried insulating layer of the semiconductor device so as to expose a portion of the crystalline material of a substrate of the semiconductor device. The method further comprises filling the first and second openings with a conductive material so as to provide a first contact region and a second contact region of the substrate diode. Additionally, a PN junction of the substrate diode is formed on the basis of the crystalline material of the substrate and on the basis of the conductive material formed in the first opening. Additionally, the method comprises forming a circuit element in and above an active region after filling the first and second openings with the conductive material. Furthermore, an interlayer dielectric material is formed above the active region and the first and second contact regions and contact elements are formed in the interlayer dielectric material so as to connect to the circuit element and to the first and second contact regions of the substrate diode.

A further illustrative method disclosed herein relates to forming a substrate diode of a semiconductor device. The method comprises forming a well region in a crystalline substrate material of the semiconductor device by implanting a well dopant species through at least a buried insulating layer formed between the crystalline substrate material and a device layer, which comprises a plurality of active regions and a plurality of isolation structures. Moreover, the method comprises forming a first opening and a second opening so as to extend through an insulating material of at least one of the isolation structures and through the buried insulating material. Moreover, the first and second openings are filled with a conductive material. Additionally, the method comprises forming a transistor in the device layer after filling the first and second openings with a conductive material.

One illustrative substrate diode of an SOI semiconductor device comprises a well region formed in a crystalline substrate material. The substrate diode further comprises first and second contact regions that extend from a device layer through a buried insulating layer and into the well region, wherein the first and second contact regions comprise a first conductive material. Moreover, an interlayer dielectric material is formed above the device layer. The substrate diode further comprises first and second contact elements that are formed in the interlayer dielectric material so as to connect to the first and second contact regions, respectively.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides techniques and semiconductor devices in which the substrate diode, or at least the contact regions thereof, may be formed in an early manufacturing stage, i.e., prior to patterning the gate electrodes of transistors, thereby providing a superior surface topography upon forming an interlayer dielectric material and corresponding contact elements. Moreover, any negative influence of certain material systems, such as plasma enhanced silicon nitride and the like, may be reduced, since a direct contact of metal silicide in combination with silicon nitride with highly doped semiconductor regions of the substrate diode may be avoided. The contact elements of the substrate diode may be formed on the basis of appropriate materials, such as semiconductor materials, in the form of silicon, silicon/germanium and the like, which may, thus, enable subsequently performing high temperature processes without deteriorating diode characteristics, thereby providing stable electronic characteristics of the substrate diode. In other cases, conductive materials, such as carbon, may be used, which may also provide high temperature stability during the subsequent processing. The conductive materials, such as silicon and the like, may be provided in an in situ doped manner, i.e., these materials may be deposited as a doped material, thereby incorporating appropriate dopant species for enhancing overall process performance and/or for incorporating a desired dopant species in order to form, in combination with subsequently implanted dopant species, an appropriate PN junction within the contact element or within the well region provided within the crystalline substrate material. In some illustrative embodiments disclosed herein, forming the substrate diode, i.e., at least the contact elements, may be accomplished with a high degree of compatibility with conventional process strategies, thereby avoiding undue additional process complexity, while nevertheless providing superior diode characteristics and increased uniformity of device performance. For instance, in some embodiments, enhanced precision and thus diode uniformity may be accomplished upon forming openings through the buried insulating material and the isolation structures by using a well-defined hard mask, which may also be used for patterning the isolation trenches upon forming trench isolation structures in the device layer. In some illustrative embodiments, the implantation process for forming the well region in the crystalline substrate material and the etch process may be performed, in addition to the hard mask material used for forming the isolation structures, on the basis of the same resist mask, thereby providing a very efficient overall process flow.

With reference to FIGS. 2a-2j, further illustrative embodiments will be now be described in more detail, wherein reference may also be made to FIGS. 1a-1f, if required.

Figure 2A:
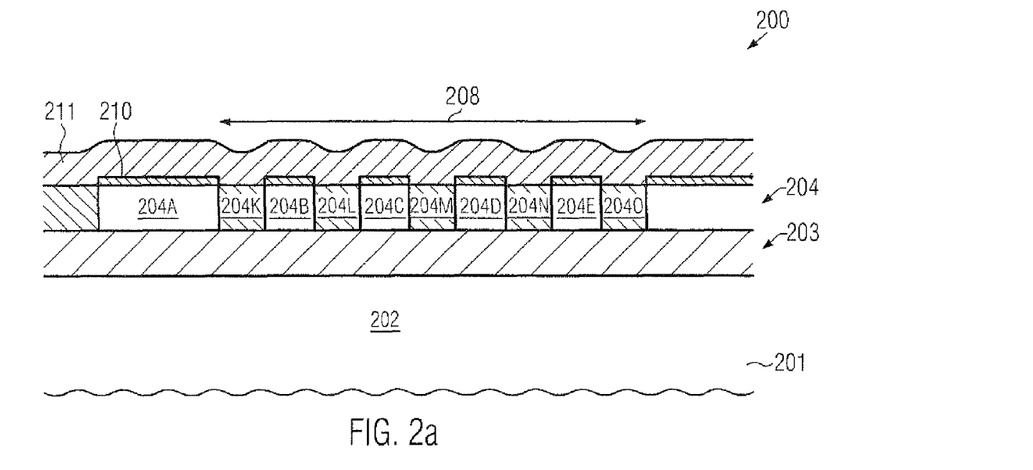
FIGS. 2a-2j schematically illustrate cross-sectional views of a semiconductor device during various manufacturing stages when forming a substrate diode in an SOI device in an early manufacturing stage, according to illustrative embodiments.

FIG. 2a schematically illustrates a cross-sectional view of a semiconductor device 200 comprising a substrate 201, which may include a crystalline substrate material 202, for instance in the form of a silicon material and the like. Moreover, a buried insulating layer 203 is formed above the crystalline substrate material 202, followed by a device layer 204, which may initially be provided in the form of a semiconductor material, as is also previously discussed with reference to the semiconductor device 100. Consequently, at least the portion shown in FIG. 2a may represent an SOI configuration. The device layer 204 may comprise a plurality of active regions 204A, 204B, 204C, 204D, 204E, wherein, in the embodiment shown, the active region 204A may represent an active region for forming therein and thereabove a transistor in a later manufacturing stage. On the other hand, the active regions 204B, 204C, 204D, 204E may be positioned in a region which may be referred to as a substrate window 208, and in which a substrate diode and corresponding contact elements are to be formed. Furthermore, a plurality of isolation structures 204K, 204L, 204M, 204N, 204O are provided in the device layer 204 within the area 208 so as to separate the active regions 204B, 204C, 204D, 204E. It should be appreciated that the lateral dimensions of the active regions 204A, 204B, 204C, 204D, 204E and of the isolation structures 204K, 204L, 204M, 204N, 204O may be appropriately selected in accordance with device requirements. In the embodiment shown, the active regions may still be covered by a hard mask material 210, such as silicon nitride, possibly in combination with an etch stop liner (not shown), and the like. Moreover, a layer of insulating material 211, such as silicon dioxide and the like, may still be provided above the device layer 204 and may represent the dielectric fill material of the isolation structures 204K, 204L, 204M, 204N, 204O.

The semiconductor device 200 as illustrated in FIG. 2a may be formed on the basis of the following processes. Based on sophisticated lithography and etch techniques, any trenches for the isolation structures 204K, 204L, 204M, 204N, 204O may be formed so as to comply with the device requirements, for instance, for laterally delineating any active regions and for defining the lateral dimensions of the substrate window 208. It should be appreciated that, typically, any isolation trenches for sophisticated semiconductor devices may be formed on the basis of high precision lithography masks so that the positioning and the size of the various device regions within the substrate window 208 may also be defined with a high degree of precision, thereby contributing to superior uniformity of a substrate diode still to be formed within the area 208. The patterning of the corresponding trenches may be accomplished on the basis of the hard mask material 210, possibly in combination with other materials, such as anti-reflective coating (ARC) materials and the like. After forming the corresponding isolation trenches, the material 211 may be deposited, for instance based on high density plasma deposition techniques, thereby providing superior gap filling capabilities in order to reliably fill and, thus, form the isolation structures 204K, 204L, 204M, 204N, 204O.

Figure 2B:
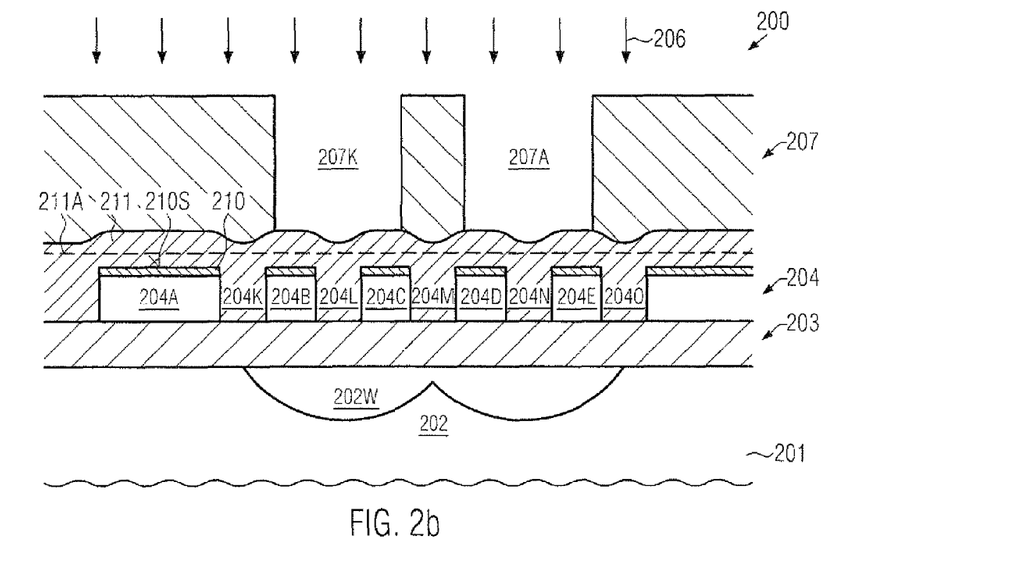

FIG. 2b schematically illustrates the semiconductor device 200 with a mask 207, such as a resist mask, which may comprise mask openings 207K, 207A, which may have appropriate lateral dimensions so as to enable the incorporation of a well dopant species into the crystalline substrate material 202, while also acting as an etch mask in the sense that an appropriate isolation structure may be selected for the further processing for providing appropriate openings to connect to a well region 202W formed in the crystalline substrate material 202. For example, the opening 207K is positioned and dimensioned such that the isolation structure 204L may be "exposed" during the processing. On the other hand, the opening 207A is dimensioned and positioned such that the isolation structure 204N may be exposed during the further processing. On the other hand, the openings 207K, 207A may enable the incorporation of the dopant species such that, at least after performing any anneal processes, the well region 202W may be provided as a continuous well region. Based on the mask 207, an implantation process 206 may be performed on the basis of appropriate implantation energy so as to incorporate the dopant species into the crystalline substrate material 202, thereby forming the well region 202W. It should be appreciated that appropriate energies may be readily determined on the basis of simulation, experiments and the like for a given thickness of the layer 211. In other cases, if desired, a portion of the material 211 may be removed, for instance by CMP and the like, thereby planarizing the surface topography, as indicated by the dashed line 211A. In still other illustrative embodiments, a corresponding material removal process may be performed such that a surface 210S of the hard mask layer 210 may be exposed, which may, thus, act as an efficient CMP stop material.

Figure 2C:
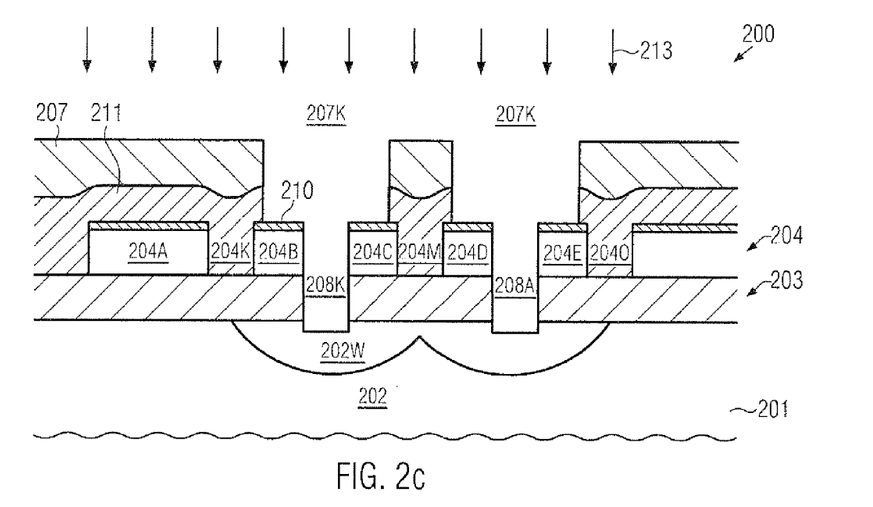

FIG. 2c schematically illustrates the semiconductor device 200 according to illustrative embodiments in which the mask 207 may be used as an etch mask during an anisotropic etch process 213, in which it may be etched through the material of the layer 211, while using the hard mask material 210 as an efficient etch stop material. Consequently, the etch front may be reliably stopped above the active regions 204B, 204C, 204D, 204E, while the etch process may further advance in the isolation structures 204L, 204N (FIG. 2b). Furthermore, during the further advance of the etch process 213, it may also be etched through the buried insulating material 203 and finally into the well region 202W. During this phase of the etch process 213, the hard mask material 210 may also act as an efficient etch mask and may, thus, define the lateral position and size of corresponding openings 208K, 208A with a high degree of precision, as is also previously discussed with reference to forming corresponding isolation trenches. As indicated before, in other cases, a more or less pronounced amount of the material 211 may have to be removed during the etch process 213, depending on the process strategy, for instance by additionally planarizing the material 211 or removing the material 211 completely outside the isolation structures 204K, 204L, 204M, 204N, 204O. After the etch process 213, the etch mask 207, which may also have been used as an implantation mask, may be removed by applying any appropriate etch recipe.

Figure 2D:
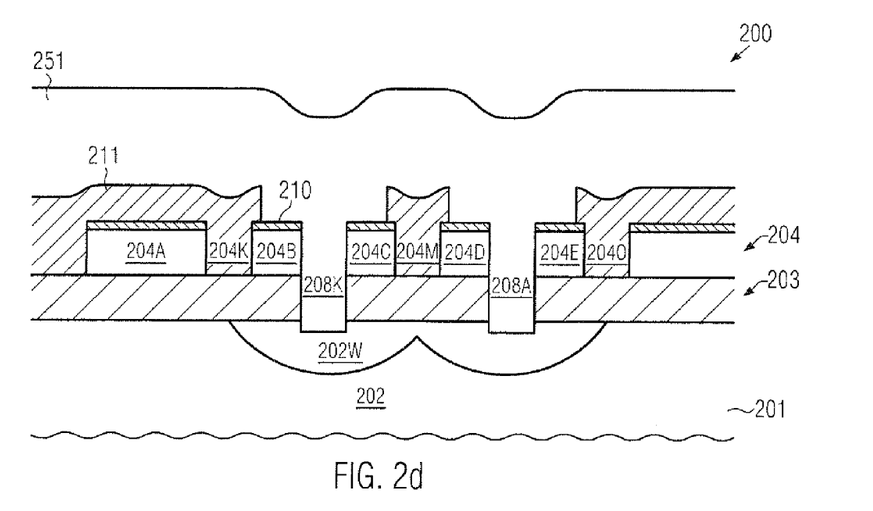

FIG. 2d schematically illustrates the semiconductor device 200 in a state in which a conductive material 251 may be formed above the device layer 204 so as to fill the openings 208K, 208A. In some illustrative embodiments, the conductive material 251 may be provided in the form of a semiconductor material, such as a silicon material, a silicon/germanium material, a germanium material and the like, wherein the material 251 may have incorporated therein a desired dopant with a desired concentration. Consequently, the material 251 may represent a material that may be essentially stable, except for a more or less degree of crystallization, during any subsequent high temperature processes. In other illustrative embodiments, the conductive material 251 may represent a carbon material, which may also have a high temperature stability, wherein, if required, the carbon material may also be provided with desired type and dopant concentration. The material layer 251 may be deposited on the basis of any appropriate deposition technique, such as low pressure CVD and the like, wherein, if required, a certain degree of in situ doping may be applied, i.e., a dopant species may be incorporated during the deposition of the material 251. In one illustrative embodiment, the material 251 may be provided in the form of a silicon material, for instance a polysilicon material, wherein a P-type dopant species may be incorporated during the deposition, thereby imparting an increased etch resistivity to the material 251 with respect to certain wet chemical etch recipes, such as hot phosphoric acid, which may be applied in a later manufacturing stage for removing the hard mask material 210, if comprised of silicon nitride.

Figure 2E:
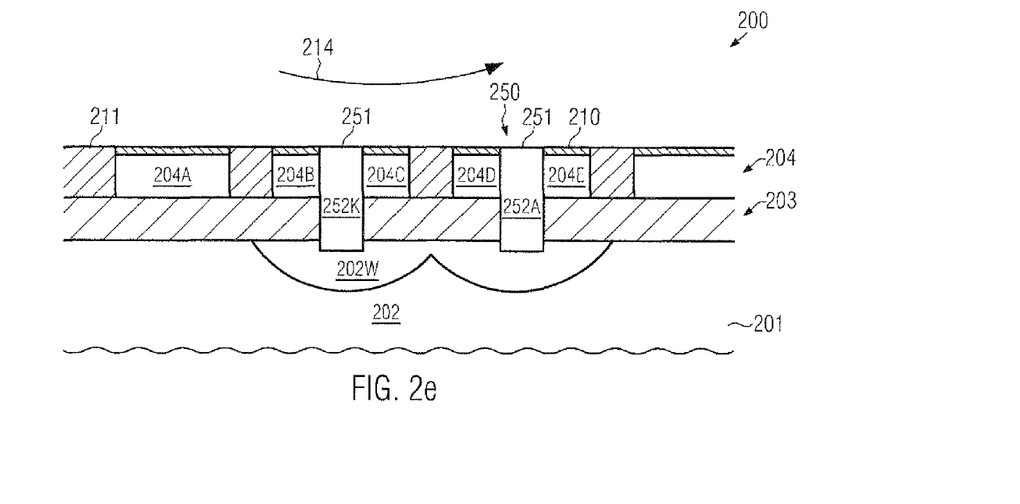

FIG. 2e schematically illustrates the semiconductor device 200 during a material removal process 214, for instance performed on the basis of a CMP process, thereby removing any excess material of the layer 251 (FIG. 2d) and also of the layer 211 (FIG. 2d), if still present in this manufacturing stage. For this purpose, well-established polishing recipes may be selected, which are typically used in conventional process strategies for forming isolation structures, and any such recipes may likely be amended so as to take into consideration the presence of the material 251, as shown in FIG. 2d. Consequently, the hard mask material 210 may also be used as an efficient stop material during the process 214, similarly as in conventional process strategies. Thus, after completing the removal process 214, contact regions 252K and 252A of a substrate diode 250 are provided so as to connect to the substrate well region 202W. That is, the contact regions 252K, 252A may represent the previously formed openings 208K, 208A (FIG. 2d), which are filled with the conductive material 251. Due to the superior temperature stability of the conductive material 251, except for a certain degree of re-crystallization, a high degree of uniformity may be accomplished for the substrate diode 250 during the further processing. It should further be appreciated that the contact elements 252K, 252A may appropriately connect with the active regions 204B, 204C on the one hand, and the active regions 204D and 204E on the other hand, thereby providing a superior contact surface upon the further processing, for instance for forming contact elements that may connect to the contact regions 252K, 252A. Moreover, by providing the contact elements 252K, 252A in combination with the surrounding active regions, an efficient decoupling of the substrate well region 202W from any further processes may be accomplished, thereby enabling the formation of an appropriate PN junction during the further processing without being influenced by critical processes, such as the formation of a metal silicide and the like, as previously discussed.

Figure 2F:
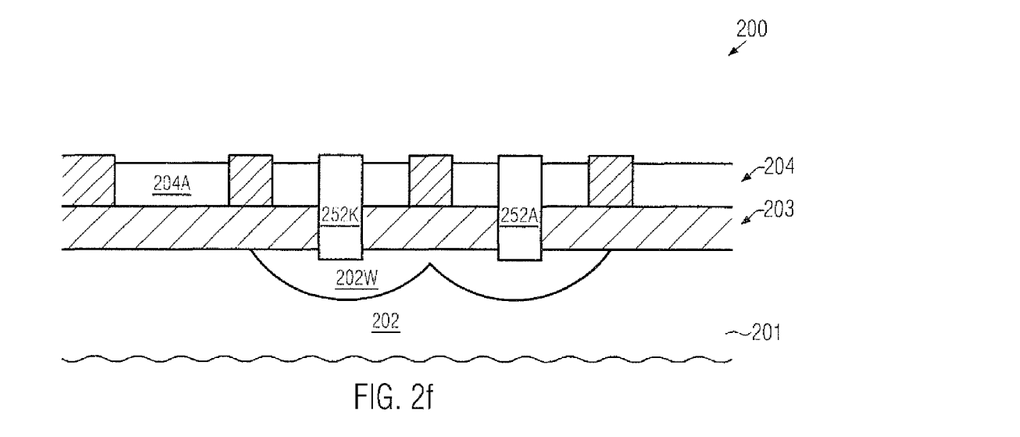

FIG. 2f schematically illustrates the semiconductor device 200 after the removal of the hard mask layer 210 (FIG. 2e), which may be accomplished on the basis of any appropriate etch recipe, such as hot phosphoric acid and the like. As explained above, if desired, superior etch resistivity may be imparted to the contact elements 252K, 252A by providing a P-type dopant species, if comprised of a polysilicon material. In other cases, the contact elements 252K, 252A may suffer from a certain material erosion, thereby maintaining a substantially flush level with the surrounding active regions, while, in still other cases, the material of the contact regions 252K, 252A may have a desired high etch resistivity, for instance when provided in the form of a carbon material.

Thereafter, the processing may be continued by providing an appropriate basic doping in the active regions, as is also previously discussed with reference to the semiconductor device 100, possibly in combination with any anneal processes for activating dopant species and re-crystallizing implantation-induced damage.

Figure 2G:
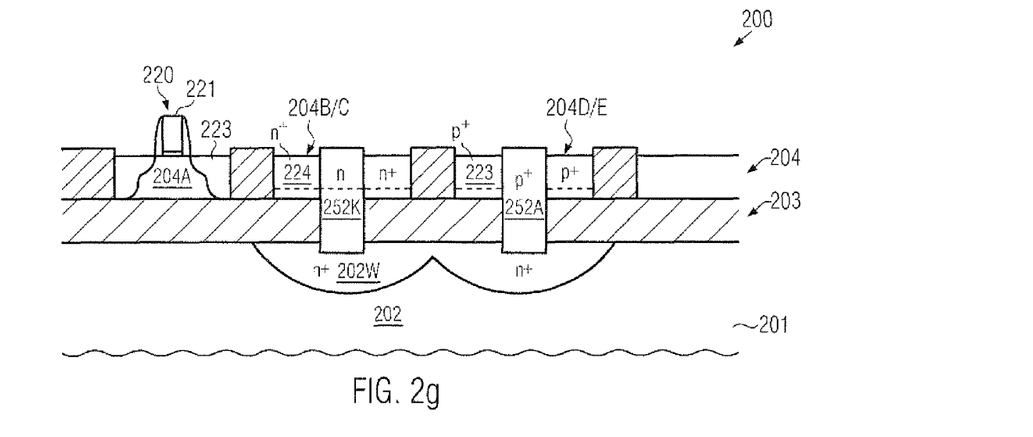

FIG. 2g schematically illustrates the semiconductor device 200 in a further advanced manufacturing stage. As illustrated, circuit elements may be formed in and above corresponding active regions, for instance a transistor 220, such as a P-channel transistor or an N-channel transistor, may be formed in and above the active region 204A. As shown, the transistor 220 may comprise a gate electrode structure 221 having any appropriate configuration so as to comply with the overall design requirements. Moreover, drain and source regions 223 may be formed in the active region 204A with an appropriate dopant concentration and profile as required for the transistor 220. For example, the drain and source regions 223 may represent highly P-doped regions, if the transistor 220 is to represent a P-channel transistor. Similarly, corresponding highly doped regions 223 may also be formed in an "active" region surrounding the contact element 252A. For convenience, the active region may be indicated as 204D/E, as this region may be considered as the combination of an upper portion of the contact region 252A in combination with the previously provided active regions 204D and 204E (FIG. 2e). Similarly, an active region 204B/C may be provided as a combination of the contact element 252K and the previously provided active regions 204B and 204C (FIG. 2e). The active region 204B/C may have incorporated therein an N-type dopant species with a high concentration, as may be required in any N-channel transistors to be formed in appropriate active regions of the device layer 204.

The semiconductor device 200 as illustrated in FIG. 2g may be formed in accordance with any appropriate process strategy for forming sophisticated transistors, wherein an appropriate masking regime may be applied so as to appropriately incorporate the highly doped regions 223 and 224 in the active regions 204D/E and 204B/C.

Figure 2H:
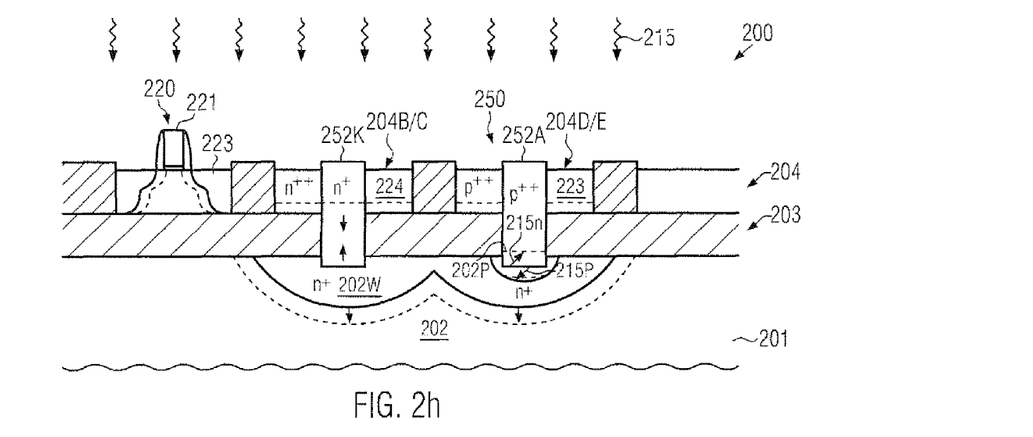

FIG. 2h schematically illustrates the semiconductor device 200 during one or more anneal processes 215, which may be performed to activate dopant species and re-crystallize implantation-induced damage, while also initiating a certain degree of dopant diffusion so as to obtain the desired final dopant profile for the transistor 220. For this purpose, a plurality of well-established process techniques are available, such as laser-based anneal, flashlight-based anneal, rapid thermal anneal and the like. Moreover, during the anneal process 215, a PN junction 202B may be established on the basis of the well region 202W and one of the contact elements 252K, 252A. In the example shown, the well region 202W may be N-doped with a desired concentration, while the active region 204D/E may have formed therein the highly P-doped region 223. As previously discussed, in some illustrative embodiments, the material of the contact regions 252A, 252K may have incorporated therein a certain basic dopant concentration, for instance a P-type dopant, so that, generally, moderately high dopant gradients exist between the well region 202W and the contact region 252A, thereby resulting in a significant dopant diffusion, wherein the PN junction 202P may form within the well region 202W or within the contact region 252A. That is, if a net dopant diffusion from the well dopant region 202W to the contact element 252A may take place, as indicated by 215n, the PN junction 202P may be located within the contact region 252A. When, on the other hand, a net dopant diffusion of P-type dopants may take place into the well region 202W, as indicated by 215P, the PN junction 202P may be positioned within the well region 202W. Thus, by appropriately selecting the basic doping of the contact regions 252A, 252K and by appropriately selecting the dopant concentration in the well region 202W, the characteristics of the PN junction 202P may be adjusted for given process parameters of forming the implantation regions 223 and 224 and for given process parameters of one or more of the anneal processes 215.

On the other hand, in the contact region 252K, a diffusion of N-type dopant species may occur from the highly doped regions 224 and in the well region 202W so that a continuous conductive path may be reliably established in the contact region 252K, even if a certain degree of counter doping may have initially been provided in the contact region 252K.

Figure 2I:
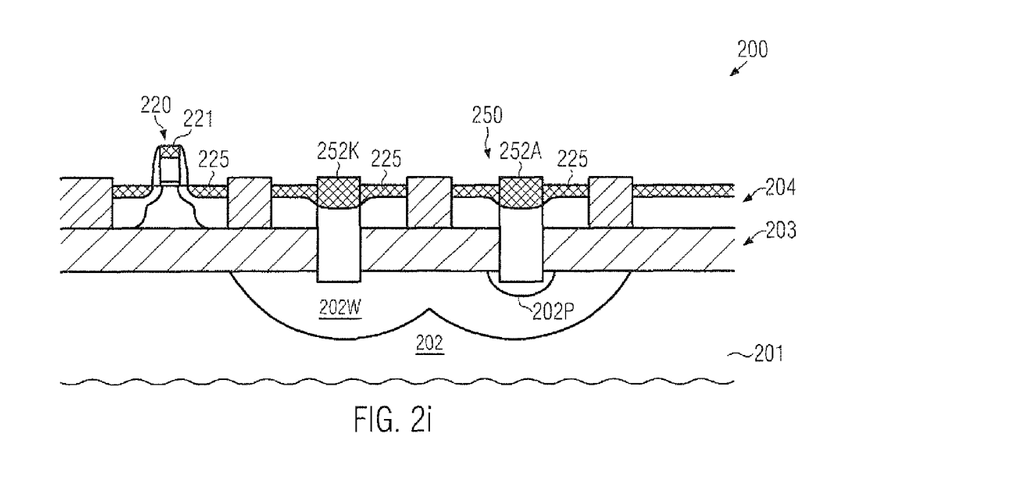

FIG. 2i schematically illustrates the semiconductor device 200 in a further advanced manufacturing stage. As illustrated, metal silicide regions 225, such as nickel silicide and the like, may be formed on exposed semiconductor areas, i.e., in the transistor 220 and in the substrate diode 250, wherein the PN junction 202P of the substrate diode 250 may remain substantially unaffected by the metal silicide regions 225. Consequently, the metal silicide 225 may be formed in accordance with requirements for obtaining a desired low contact resistance; while superior etch resistivity may not be required, as may be the case in the conventional strategy, as previously described with reference to the semiconductor device 100.

Figure 2J:
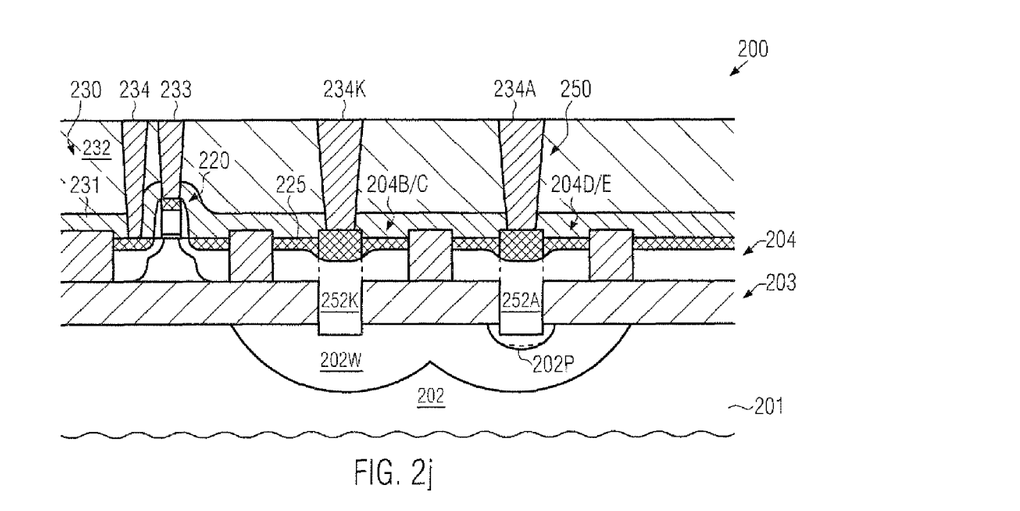

FIG. 2j schematically illustrates the semiconductor device 200 in a further advanced manufacturing stage. As illustrated, an interlayer dielectric material 230 may be formed above the device layer 204 and may comprise contact elements 234, 233, which may connect to the transistor 220. Moreover, a contact element 234K may be provided, which may connect to the contact region 252K, that is, to the metal silicide region 225 formed in the active region 204B/C. Similarly, a contact element 234A may be provided so as to connect to the contact region 252A, i.e., to the metal silicide 225 in the active region 204D/E. Thus, as illustrated, the contact elements 234 for the transistor 220 and the contact elements 234K, 234A for the substrate diode 250 extend to substantially the same height level, thereby providing significantly enhanced process uniformity upon forming the interlayer dielectric material 230, patterning the same and refilling corresponding openings with any appropriate conductive material, such as tungsten, copper, aluminum and the like. Furthermore, as previously explained with reference to the semiconductor device 100, any desired composition of the interlayer dielectric material 230 may be selected without unduly affecting the substrate diode 250, the characteristics of which are substantially determined by the PN junction 202P. For instance, a material 231 in the form of a silicon nitride material may be provided, in combination with a silicon dioxide material 232, wherein, in addition to superior flexibility in selecting appropriate materials, a reduced surface topography may be provided upon depositing the interlayer dielectric material 230. Thus, well-established process strategies may be applied, wherein, compared to conventional approaches, an enhanced degree of process uniformity may be achieved.

It should be appreciated that, in the above-described embodiment, a highly efficient overall manufacturing flow may be provided, while a high degree of compatibility with conventional approaches may be preserved. For example, in the embodiment illustrated in FIGS. 2a-2j, only one additional deposition process may be required for providing the conductive material for the contact regions 252A, 252K, as shown in FIG. 2d. In other cases, additional processes may be implemented, if considered appropriate, for instance with respect to providing the planarized surface upon providing a mask for forming the well region 202W and/or for performing corresponding etch processes, as is also discussed above. Moreover, it should be appreciated that the selection of the dopant species in the substrate diode is of illustrative nature only, and appropriate substrate diodes may also be formed on the basis of a configuration in which any dopant may be replaced by dopants of inverse conductivity type, if desired. Furthermore, in the above-illustrated embodiments, the contact regions 252A, 252K may be formed on the basis of individual isolation structures 204K, 204L, 204M, 204N, 204O (FIG. 2a) so that the lateral position and size of openings for the contact regions 252A, 252K may be defined on the basis of a hard mask material, as is also used for forming the isolation structures. In other cases, the contact regions 252A, 252K may be formed in a single isolation structure of appropriate size. For this purpose, an isolation structure may be applied, which is also described with reference to the semiconductor device 100. In this case, the lateral size and position of the contact elements 252A, 252K may be defined by an etch mask without requiring a hard mask material. In this case, the upper portions of the contact regions 252A, 252K may not be laterally enclosed by corresponding active regions, as is described above.

As a result, the present disclosure provides semiconductor devices and manufacturing techniques in which a substrate diode of an SOI device may be provided with superior stability with respect to process variations, materials, device topography and the like. To this end, the sensitive diode PN junction may be appropriately covered by contact regions, for instance provided in the form of a stable semiconductor material, a carbon material and the like. Consequently, any further process, such as the formation of a metal silicide, providing appropriate materials, such as silicon nitride, performing any implantation processes, cleaning processes and the like, may not substantially affect the characteristics of the PN junction. For instance, any direct contact with nickel material may be efficiently avoided, thereby suppressing nickel diffusion into the sensitive diode PN junction. Furthermore, the interlayer dielectric material may be provided on the basis of a superior surface topography and the contact elements formed therein have to extend to the device layer only, thereby providing superior flexibility in configuring corresponding metal silicide regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a substrate diode in a semiconductor device, the method comprising:
    forming a well region of said substrate diode in a crystalline material of a substrate of said semiconductor device;
    forming a first opening through a first trench isolation structure and a second opening through a second trench isolation structure after forming the well region, said first and second openings extending through a buried insulating layer of said semiconductor device so as to expose a portion of the well region
    filling said first and second openings with a conductive material so as to provide a first contact region and a second contact region of said substrate diode;
    forming a PN junction of said substrate diode on the basis of the well region and said conductive material formed in said first opening;
    forming a circuit element in and above an active region after filling said first and second openings with said conductive material;
    forming an interlayer dielectric material above said active region and said first and second contact regions; and
    forming contact elements in said interlayer dielectric material so as to connect to said circuit element and to said first and second contact regions of said substrate diode.

2. The method of claim 1, wherein said conductive material comprises a semiconductor material.

3. The method of claim 1, wherein said conductive material comprises carbon.

4. The method of claim 1, wherein forming said conductive material comprises depositing said conductive material as an in situ doped material.

5. The method of claim 1, wherein forming said first and second openings comprises providing active regions laterally adjacent to each of said first and second trench isolation structures and using a hard mask formed on said active regions as an etch mask.

6. The method of claim 5, further comprising removing said hard mask and excess material of said conductive material by performing a polishing process.

7. The method of claim 1, further comprising forming the well region of said substrate diode in said crystalline material by using a mask having formed therein a first mask opening and a second mask opening.

8. The method of claim 7, wherein said first and second openings are formed by using said mask after forming the well region.

9. The method of claim 1, wherein forming said PN junction comprises introducing a dopant species of a first conductivity type into said first contact region and a dopant species of an inverse conductivity type into said second contact region and initiating dopant diffusion by performing an anneal process.

10. A method of forming a substrate diode of a semiconductor device, said method comprising:
    forming a well region in a crystalline substrate material of said semiconductor device by implanting a well dopant species through at least a buried insulating layer formed between said crystalline substrate material and a device layer comprising a plurality of active regions and a plurality of isolation structures;
    forming a first opening and a second opening after forming the well region, wherein the first and second openings extend through an insulating material of at least one of said isolation structures and through said buried insulating material to expose the well region;
    filling said first and second openings with a conductive material; and
    forming a transistor in said device layer after filling said first and second openings with a conductive material.

11. The method of claim 10, wherein said well region and said first and second openings are formed by using the same mask layer formed above said device layer.

12. The method of claim 11, wherein forming said first and second openings further comprises using said mask and a hard mask material formed on said plurality of active regions as an etch mask.

13. The method of claim 10, wherein filling said first and second openings comprises forming a semiconductor material in said first and second openings.

14. The method of claim 10, wherein filling said first and second openings comprises forming a carbon comprising material in said first and second openings.

15. The method of claim 10, wherein filling said first and second openings comprises forming an in situ doped material in said first and second openings.

16. The method of claim 10, further comprising forming an interlayer dielectric material above said device layer and forming contact elements in said interlayer dielectric material so as to connect to said circuit element and said first and second contact regions of said substrate diode.

17. The method of claim 10, further comprising forming a PN junction of said substrate diode by initiating an interdiffusion of said well dopant species and an inverse dopant species provided in said conductive material formed in said first opening.

* * * * *